United States Patent
Cagli (10) Patent No.: US 9,299,882 B2
(45) Date of Patent: Mar. 29, 2016

(54) OPTIMISED METHOD FOR PRODUCING ELECTROLUMINESCENT NANOWIRES

(71) Applicant: ALEDIA, Grenoble (FR)

(72) Inventor: Carlo Cagli, Grenoble (FR)

(73) Assignee: ALEDIA, Grenoble (FR)

( * ) Notice: Subject to any disclaimer, the term of this patent is extended or adjusted under 35 U.S.C. 154(b) by 0 days.

(21) Appl. No.: 14/653,241

(22) PCT Filed: Oct. 10, 2013

(86) PCT No.: PCT/EP2013/071161
§ 371 (c)(1),
(2) Date: Jun. 17, 2015

(87) PCT Pub. No.: WO2014/095110
PCT Pub. Date: Jun. 26, 2014

(65) Prior Publication Data
US 2015/0340548 A1 Nov. 26, 2015

(30) Foreign Application Priority Data

Dec. 20, 2012 (FR) ...................... 12 62474

(51) Int. Cl.
| | |
|---|---|
| H01L 21/00 | (2006.01) |
| H01L 33/00 | (2010.01) |
| H01L 33/06 | (2010.01) |
| H01L 33/08 | (2010.01) |
| H01L 33/18 | (2010.01) |
| H01L 29/06 | (2006.01) |
| H01L 21/02 | (2006.01) |
| H01L 33/24 | (2010.01) |

(52) U.S. Cl.
CPC ........ *H01L 33/0075* (2013.01); *H01L 33/0095* (2013.01); *H01L 33/06* (2013.01); *H01L 33/08* (2013.01); *H01L 33/18* (2013.01); *H01L 21/02603* (2013.01); *H01L 29/0669* (2013.01); *H01L 33/24* (2013.01); *H01L 2933/0016* (2013.01)

(58) Field of Classification Search
None
See application file for complete search history.

(56) References Cited

U.S. PATENT DOCUMENTS

| | | | |
|---|---|---|---|
| 8,664,636 B2 * | 3/2014 | Konsek ............... | H01L 29/0673 257/13 |
| 2003/0181122 A1 | 9/2003 | Collins, III et al. | |
| 2006/0019472 A1 * | 1/2006 | Pan ........................ | B82Y 10/00 438/486 |

(Continued)

FOREIGN PATENT DOCUMENTS

DE          103 12 526 A1      10/2003

*Primary Examiner* — Angel Roman
(74) *Attorney, Agent, or Firm* — Baker & Hostetler LLP (57) ABSTRACT

A process for fabricating an array of nanowires on the surface of a substrate, the nanowires comprising a portion capable of emitting radiation under action of an electrical or optical control and at least partially connected to one another electrically via a conductive upper layer, comprises steps allowing a subset of defective nanowires to be identified among active nanowires, the steps comprising: producing a layer of negative photoresist sensitive to the emission wavelength, covering the array of the nanowires; activating the array of the nanowires under electrical control or optical control so the active nanowires emit the radiation, the radiation decreasing the solubility of the negative resist; developing the resist level with the defective nanowires, leaving zones made less soluble and encircling the active nanowires; and removing the conductive layer above the defective nanowires. A process for fabricating one or more light-emitting diodes using the process is provided.

12 Claims, 12 Drawing Sheets

(56) References Cited

U.S. PATENT DOCUMENTS

| | | | |
|---|---|---|---|
| 2011/0240959 A1* | 10/2011 | Konsek | H01L 29/0673 257/13 |
| 2012/0164767 A1 | 6/2012 | Gasse et al. | |
| 2013/0240348 A1* | 9/2013 | Mi | H01L 31/03044 204/157.5 |

* cited by examiner

OPTIMISED METHOD FOR PRODUCING ELECTROLUMINESCENT NANOWIRES

CROSS-REFERENCE TO RELATED APPLICATIONS

This application is a National Stage of International patent application PCT/EP2013/071161, filed on Oct. 10, 2013, which claims priority to foreign French patent application No. FR 1262474, filed on Dec. 20, 2012, the disclosures of which are incorporated by reference in their entirety.

FIELD OF THE INVENTION

The field of the invention is that of components that are based on light-emitting nanowires and that are able for example to be used to produce light—light-emitting diodes (LEDs) notably.

BACKGROUND

In the last few years visible light-emitting diodes (LEDs) based on vertical InGaN/GaN nanowires containing a p-n junction and connected collectively in parallel have for example been produced.

Generally, the term "nanowire" designates a wire the base of which is possibly as small as a few hundred nanometers in size.

By virtue of their potential intrinsic properties (good crystal quality, strain relaxation at the vertical free surfaces, good light extraction efficiency via waveguiding, etc.) nanowires are considered to be very promising candidates for alleviating the difficulties currently encountered with conventional GaN LEDs fabricated with a planar (2D) structure.

Two approaches for producing nanowire LEDs, which approaches are based on different growth techniques, have been developed at the CEA, Grenoble.

The first technological approach consists in growing GaN nanowires containing InGaN quantum wells epitaxially in an axial configuration by molecular beam epitaxy (MBE). Devices fabricated from these nanowires have yielded very exciting results in the green spectral domain. Processed chips of 1 mm$^2$ are able to emit about 10 µW at 550 nm for a DC operating current of 100 mA.

Figure 1:
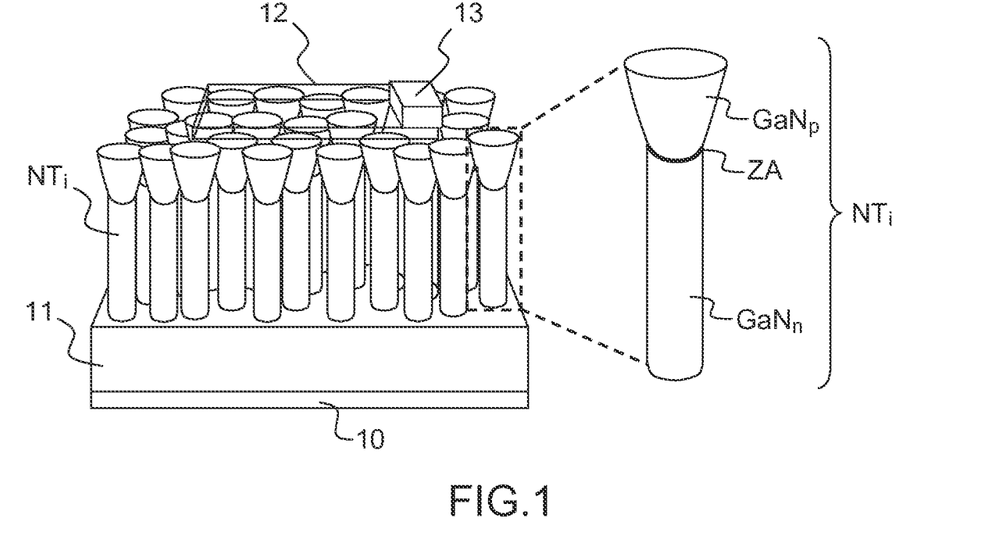
FIG. 1 illustrates a first LED configuration using axially structured nanowires according to the prior art.

FIG. 1 illustrates such a configuration showing nanowires NTi on the surface of a substrate 11 (typically made of silicon) making contact with a lower contact 10, the upper p-type contact being ensured by a transparent layer 12; contact redistribution is achieved via a thick redistribution contact 13. The axially structured nanowires NTi contain an n-doped zone possibly, and typically, made of n-doped GaN, an active zone ZA made of InGaN or possessing a quantum well or multi-quantum well structure and a p-doped zone possibly made of p-doped GaN.

With the molecular beam epitaxy (MBE) technique, certain nonuniformities appear because of random nucleation mechanisms, but typically an optical power of 50 nW has been obtained for a single wire emitting at 550 nm, i.e. 5 W/mm2 with one hundred nanowires emitters/mm2.

More recently, the metal organic chemical vapor deposition (MOCVD) growth technique has allowed InGaN/GaN nanowires containing a radial LED structure (core/shell configuration) to be produced.

Figure 2:
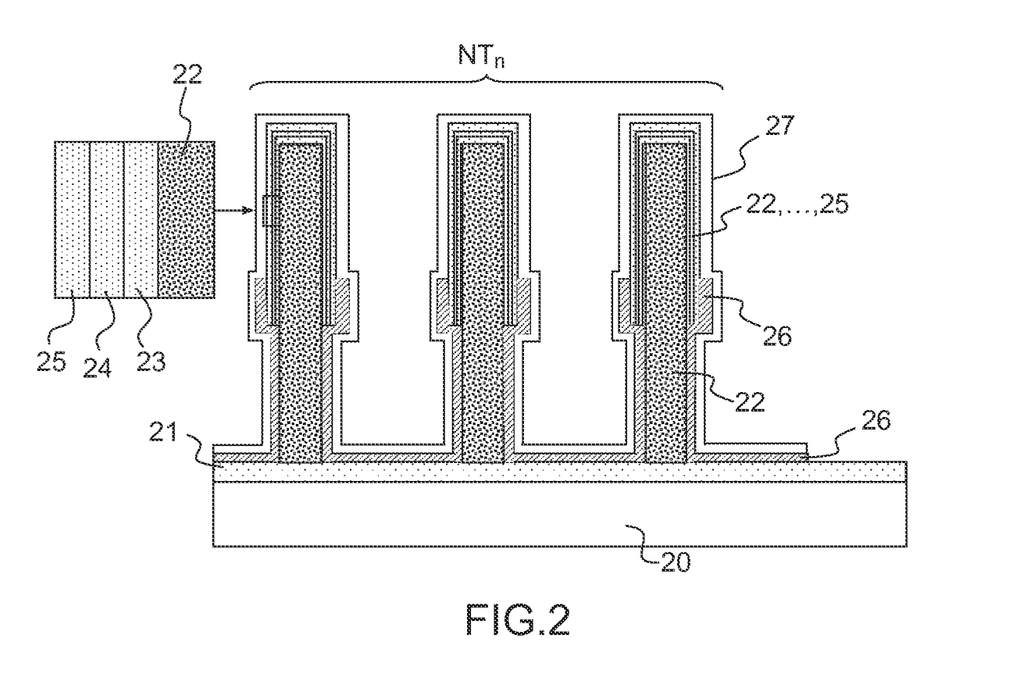
FIG. 2 illustrates a second LED configuration using radially structured nanowires according to the prior art.

FIG. 2 illustrates this type of configuration, in which nanowires NTn are produced on the surface of a substrate 20 covered with a nucleation layer 21 that enables lattice matching between, for example, a silicon substrate and GaN nanowires.

The structure of the nanowires comprises a photoconductive portion, made up of: a core 22 made of n-doped GaN, typically doped with a dopant density of 1019 cm-3; a quantum well structure made up of alternating layers 24, 23 that may possibly be InGaN and undoped GaN, respectively; and lastly a p-doped GaN layer 25 typically doped with a dopant density of 1019 cm-3. An insulating dielectric layer 26 is provided in order to insulate the core 22 and the upper contact. It may typically be a question of an SiO2 or SiN deposit. The upper contacts are made via a conductive upper layer 27 that is transparent to the emission wavelength of the photoconductive structure.

In this technological approach, since the LED structure has a core/shell configuration, the area of the active zone is larger than in the 2D nanowire LED approach.

This property has two advantages: it increases emissive area and decreases current density in the active zone. Complete MOCVD nanowire LED structures have been produced on a silicon substrate, and light emission in the blue spectral domain (450 nm) has been obtained for an integrated array of nanowires after technological processing.

Because of the technologies used to grow the nanowires, hundreds of thousands of wires may be produced on the surface of a chip on an area possibly, and typically, of 1 mm$^2$.

Such novel structures, which capitalize on the emergence of nanotechnologies, have the advantage of increasing emission area and therefore the emitted light flux.

Nevertheless, since this type of LED is composed of a very substantial number of nanowires connected in parallel, it will be noted that even a very small number of defective nanowires may be responsible for poor fabrication process reproducibility and cause LED malfunction.

Specifically, if an elementary LED of a few millimeters squared comprises less than 0.1% defective nanowires, this corresponds to about one hundred nanowires that are unusable, notably because of short circuits or structural defects that lead the active zone not to function properly, being generated in the fabrication process.

Generally, nanowires may also be capable of absorbing radiation at a first wavelength shorter than their emission wavelength, thus allowing them to be controlled optically so as to emit at a desired emission wavelength.

SUMMARY OF THE INVENTION

It is in this context that the present invention provides an optimized process for fabricating devices and notably LEDs, this process allowing defective nanowires to be isolated.

More precisely, one subject of the present invention is a process for fabricating an array of nanowires on the surface of a substrate, said nanowires comprising a portion capable of emitting radiation at at least one wavelength λ under the action of an electrical or optical control and being at least partially connected to one another electrically via a conductive upper layer, characterized in that it comprises steps allowing a subset of defective nanowires to be identified among active nanowires, said steps comprising:

producing a layer of negative photoresist sensitive to said emission wavelength λ, covering the array of said nanowires;

activating the array of said nanowires under electrical control or under optical control so that said active nanowires emit said radiation toward said resist, said radiation decreasing the solubility of said negative resist;

developing said resist level with the defective nanowires, leaving zones made less soluble and encircling said active nanowires; and removing said conductive layer above said defective nanowires.

According to one variant of the invention, said resist containing interstices between two consecutive nanowires, the process comprises producing features that are absorbent at said wavelength λ in said interstices.

Advantageously, the negative photoresist may be conformal so as to form a conformal coating that matches the shape of the nanowires.

Another subject of the invention is a process for fabricating an array of nanowires on the surface of a substrate, said nanowires comprising a portion capable of emitting radiation at at least one wavelength λ under the action of an electrical or optical control and being at least partially connected to one another electrically via an upper conductive layer, characterized in that it comprises steps of identifying a subset of defective nanowires among active nanowires, said steps comprising:

depositing a layer of positive photoresist that is absorbent and sensitive to what is referred to as an auxiliary wavelength λa, covering all of said nanowires;

exposing said positive resist, except in regions located between two consecutive nanowires, to radiation at said auxiliary wavelength λa;

developing said positive resist so as to define features of decreased solubility located in said regions between two consecutive nanowires on the surface of said substrate;

depositing a layer of negative photoresist sensitive to said emission wavelength λ, covering all of said nanowires and all of the features located between two consecutive nanowires;

activating all of said nanowires under electrical control or optical control so that said active nanowires emit said radiation, said radiation decreasing the solubility of said negative resist;

developing said negative photoresist level with the defective nanowires, leaving zones made less soluble and encircling said active nanowires; and removing said conductive layer above said defective nanowires.

According to one variant of the invention, the structure of the nanowires, which are possibly made of GaN or an alloy based on GaN, is based on a III-V heterojunction.

According to one variant of the invention, the process comprises producing contacts through said negative photoresist.

According to one variant of the invention, the activation of said nanowires generates a dose of about 300 to 400 mJ/cm2 in the negative photoresist.

According to one variant of the invention, said nanowires are activated with an optical control; it is typically possible to use an HeCd laser emitting at an excitation wavelength of 235 nm shorter than the emission wavelength of the nanowires and to which the active zone of the nanowires is sensitive in order to emit radiation at another wavelength.

According to one variant of the invention, the conductive layer is removed by a chemical operation.

According to one variant of the invention, the substrate is made of highly n-doped silicon, typically doped with a dopant density of 1019 cm-3.

Advantageously, provision may be made to deposit a metal layer in the interstices between nanowires so as to provide a function ensuring reflection of the radiation emitted at said wavelength λ, relative to the silicon substrate.

According to one variant of the invention, the process comprises epitaxial growth of heterojunction nanowires based on GaN or an alloy containing GaN, GaN or an alloy containing n-doped GaN and GaN or an alloy containing p-doped GaN.

According to one variant of the invention, the process comprises steps of axial epitaxial growth in a plane perpendicular to the substrate.

According to one variant of the invention, the process comprises steps of radial epitaxial growth in a plane parallel to the plane of the substrate.

According to one variant of the invention, the epitaxial growth steps are carried out by MOCVD.

According to one variant of the invention, the conductive layer is made of indium tin oxide (ITO) or of zinc oxide.

According to one variant of the invention, the process comprises a step of depositing a metal layer on the substrate between the nanowires, this layer possibly being reflective with respect to the emission at the wavelength λ.

Another subject of the invention is a process for fabricating light-emitting diodes, characterized in that it comprises the process for fabricating an array of nanowires on the surface of a substrate according to the invention.

Yet another subject of the invention is a process for wafer-scale fabrication of an array of light-emitting diodes on the surface of a substrate, characterized in that it comprises:

the process for fabricating a series of arrays of nanowires on the surface of said substrate, said nanowires comprising a photo conductive portion capable of emitting radiation at at least one wavelength λ according to the invention; and cutting said substrate so as to obtain unitary light-emitting diodes each comprising one array of nanowires.

BRIEF DESCRIPTION OF THE DRAWINGS

The invention will be better understood and other advantages will become apparent on reading the following nonlimiting description given with regard to the appended figures, in which.

DETAILED DESCRIPTION

The invention will be described more precisely below in the context of fabrication of light-emitting diodes using GaN-based photoconductive materials emitting in the blue spectral domain (450 nm) and of core/shell structure, and fabricated on a silicon substrate.

Although generally the substrate used may be made of GaN, or sapphire or indeed of silicon, the latter nevertheless has many advantages and notably in terms of cost with regard to mass production, since it is very widely used as a substrate in microelectronic technology.

Figure 3:
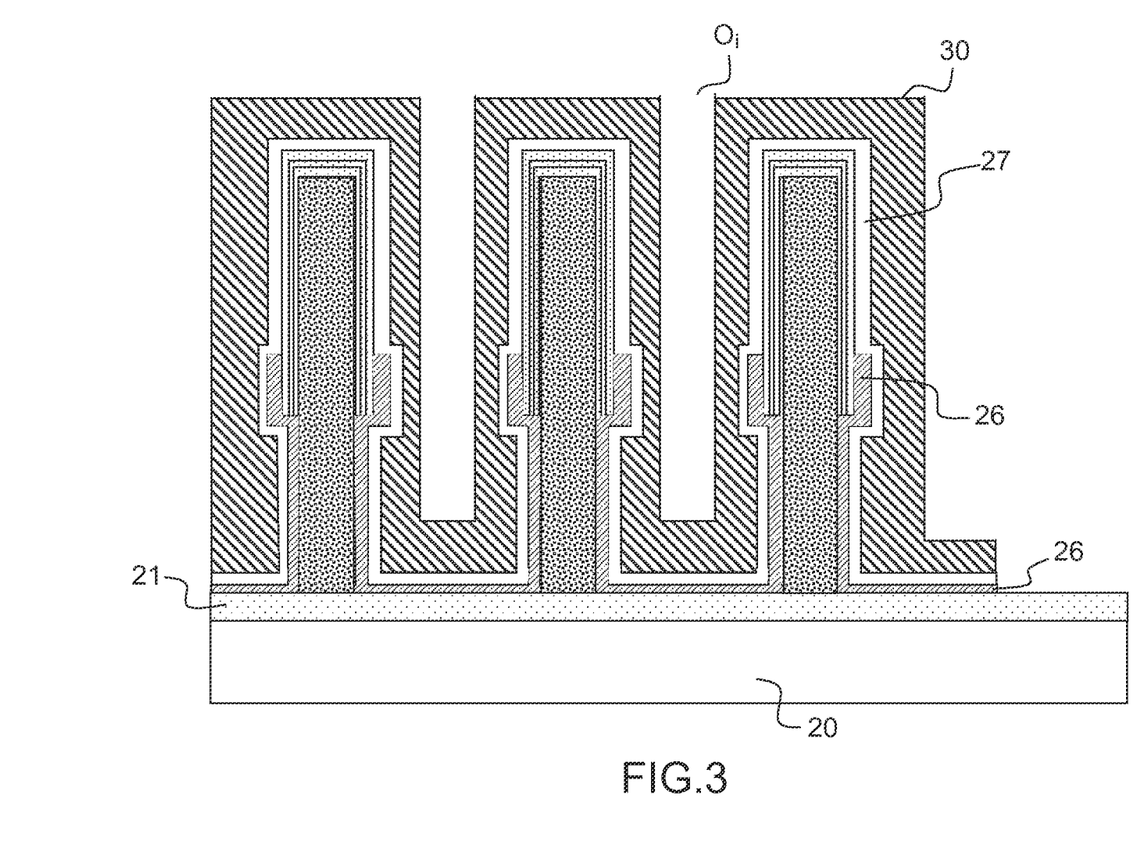
FIG. 3 illustrates the deposition of a conformal negative resist used in a second step of the first example of the process according to the invention for fabricating nanowires on the surface of a substrate.
Figure 4A:
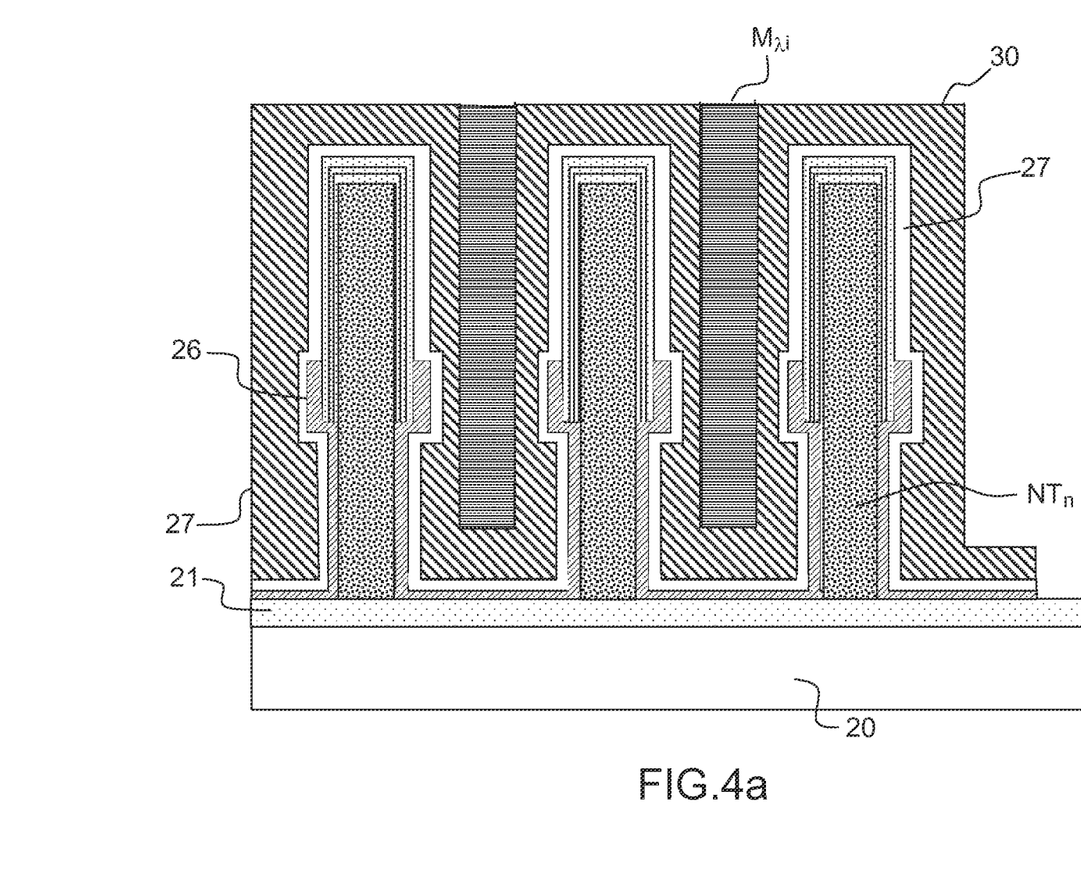
FIGS. 4a to 4c illustrate a third step of the first example of a process according to the invention, which step comprises producing absorbent features and the electrical control of the structure thus obtained, and allows defective nanowires to be identified.
Figure 4B:
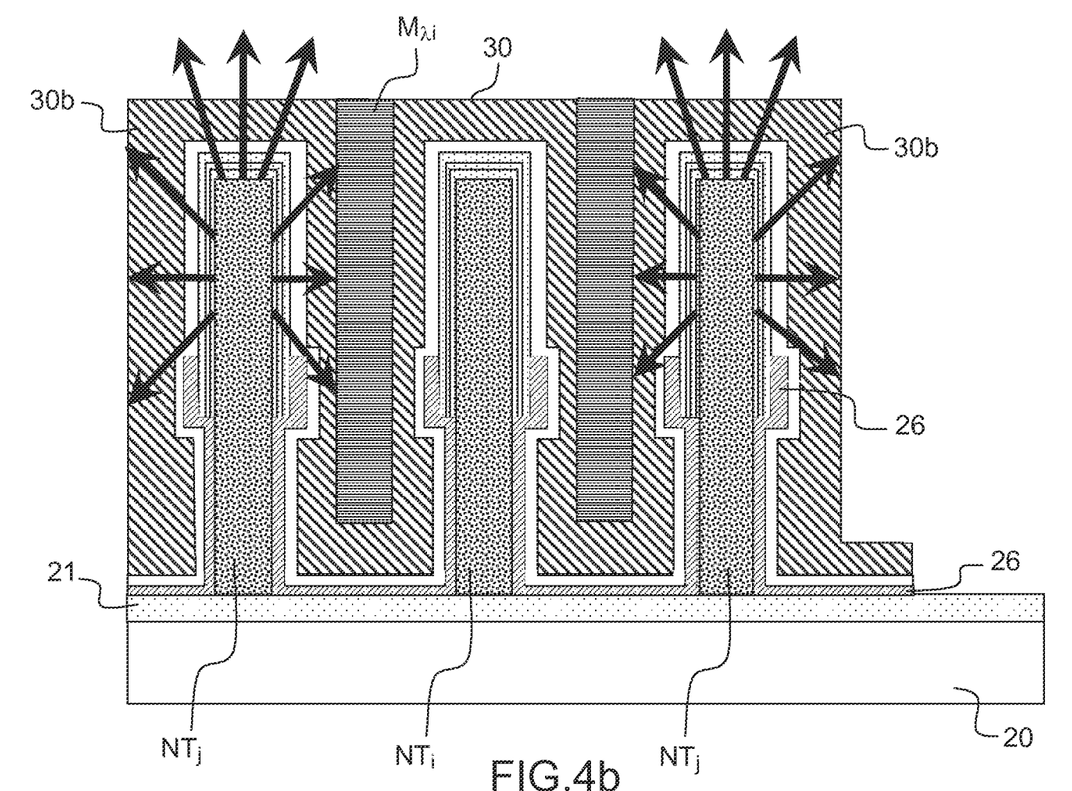
Figure 4C:
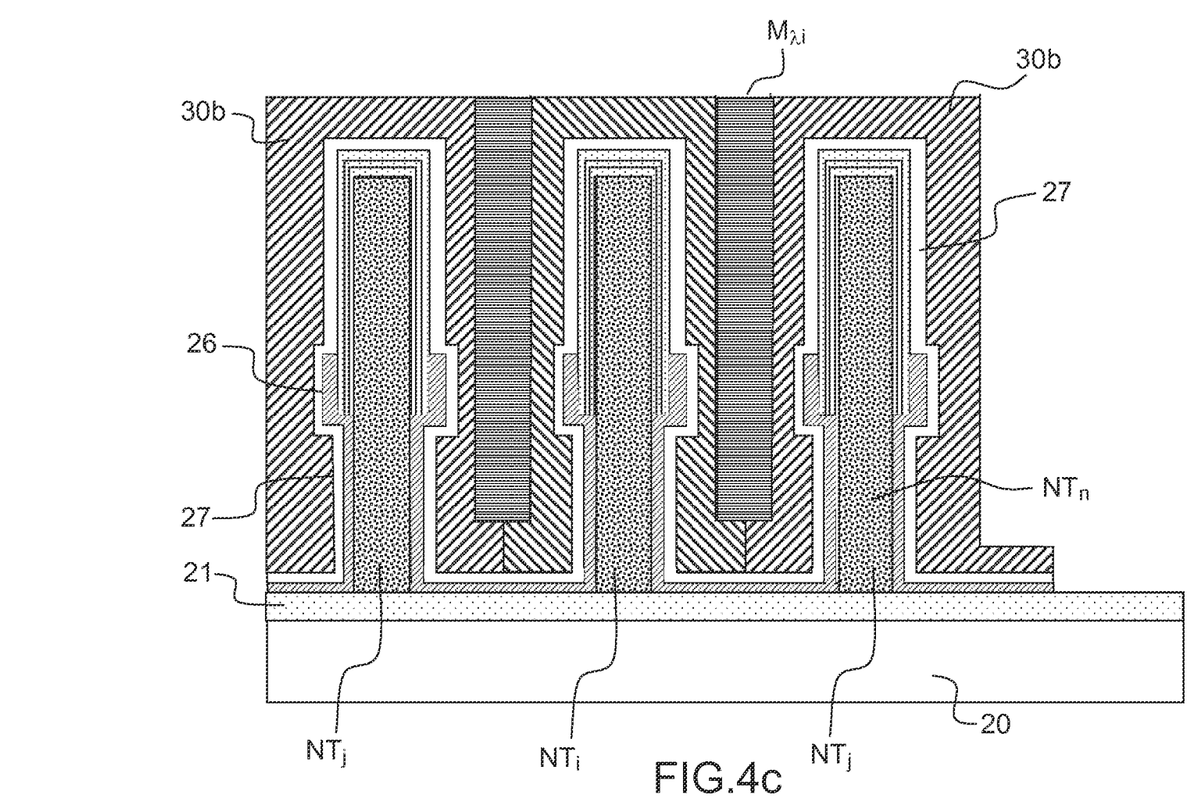
Figure 5:
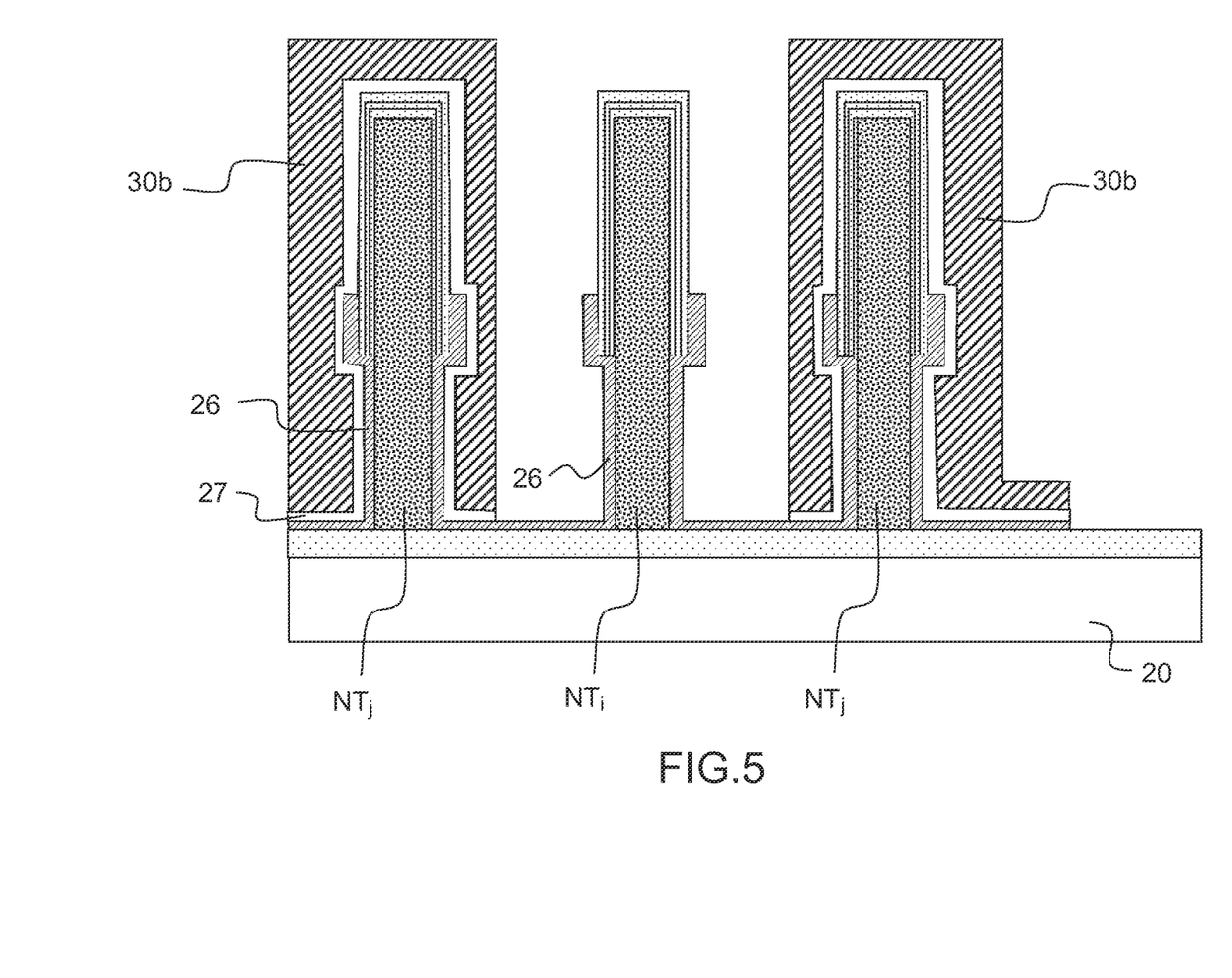
FIG. 5 illustrates a fourth step relating to exposure of defective nanowires in the first example of a process according to the invention.

A First Example of a Fabrication Process is Illustrated Notably by Virtue of FIGS. 3 to 5 and with Respect to a Core/Shell Nanowire Structure:

First Series of Steps Common to the Prior Art:

An array of nanowires NTn such as those illustrated in FIG. 2 is produced.

Second Series of Steps:

As illustrated in FIG. 3, a negative photoresist 30 sensitive in the range of emission wavelengths of the photoconductive nanowires is then deposited. With this type of negative resist, in the exposed zones, the photons react with the negative photoresist and degrade its solubility properties, the exposed resist becoming less soluble.

Selected features may then possibly be revealed in a developer (typically an aqueous basic solution) since zones that are not very soluble in the developer are left in place on the surface of the substrate, the rest of the resist being dissolved therein.

The resist may in addition be chosen so as to be capable of forming a conformal coating, i.e. of matching as closely as possible the shape of the nanowires. It may for example be a question of a sprayable XP Microspray© resist from Micro-Chem. The conformal resist coating formed allows interstices or apertures Oi to be left between two adjacent nanowires.

During the step of depositing the photoresist, contact pads (not shown) are protected.

Third Series of Steps:

The process then continues, as illustrated in FIG. 4a, with deposition of an ink in the interstices Oi, allowing absorbent features Mλi made of a material that is absorbent in the wavelength range of sensitivity of the nanowires to be defined. Typically, it may be a question of a mixture of copper phthalocyanine and disazopyrazolone in an acrylic solution.

By injecting current from the control pads, the nanowires are activated as illustrated in FIG. 4b. This figure shows two active nanowires NTj and one defective nanowire NTi, the radiation emitted by the nanowires being represented by the thick arrows. The advantage of the absorbing ink and thus of the features Mλi in the interstices Oi lies in the fact that they prevent the resist coating a defective nanowire from being illuminated by a neighboring nanowire.

The illumination generated creates, in the regions 30b of resist, zones of resist that are relatively insoluble as shown in FIG. 4c, which depicts exposed resist portions differently from unexposed resist portions.

To carry out this test phase, it is advantageously possible to use a control board that acts as an interface between an electronic test system and the substrate on which the array of nanowires has been produced.

Typically, the control board is mechanically coupled to a test bed and electrically connected to a control apparatus. Its aim is to provide an electrical path between the test system and the circuits on the substrate comprising the array of nanowires, and thus to allow the circuits to be tested and validated on the wafer scale, most often before the substrate has been cut into elementary modules.

An alternative to electrical control is optical control. Specifically, it is also possible to excite all the nanowires NTn at a wavelength at which they are sensitive in order to make them emit radiation at a chosen emission wavelength.

It is possible to use a laser emitting at an excitation wavelength of 235 nm shorter than the emission wavelength of the nanowires and to which the resist 30 is transparent. Nanowires that are defective, for example because of structural defects, will not be able to emit radiation capable of modifying the solubility of the negative photoresist and it is therefore possible to preserve a protective envelope around the active nanowires NTi.

Fourth Series of Steps:

The photoresist is then developed and removed in the regions where it has not been made relatively insoluble (and therefore everywhere except the regions 30b), said regions also incorporating the absorbing elements. It is advantageously possible to use a solution based on a quaternary ammonium compound chosen from the group made up of tetramethylammonium hydroxide (TMAH), known for its selective behavior notably with respect to metal elements. The concentration of this solution may for example be 0.26 N.

It is then possible to remove the conductive layer 27, which is possibly made of ITO, level with nanowires that are defective because of short circuits since said nanowires are now exposed. This removal may be carried out by chemical etching. Typically, in the case of ITO, a solution based on HCl and FeCl3 in a ratio of 2:1.5 may be used. FIG. 5 shows this removal of the conductive layer.

Figure 6:
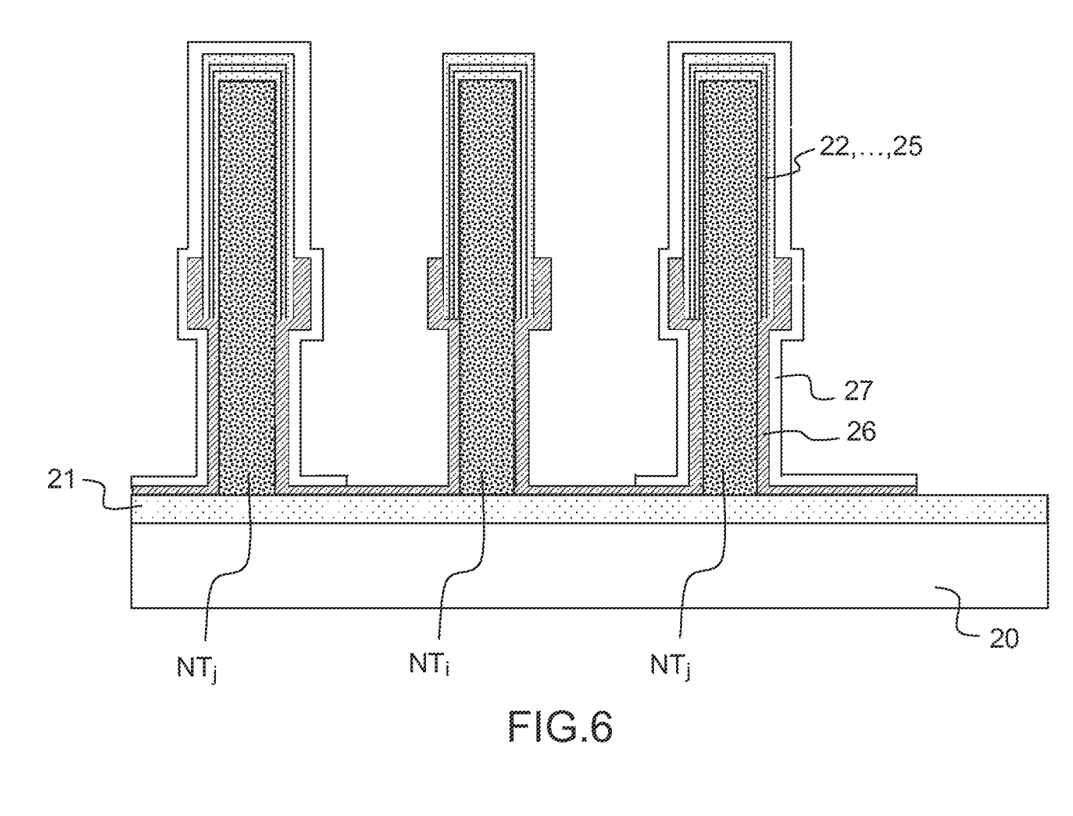
FIG. 6 illustrates a fifth step relating to complete removal of the negative resist.

Fifth Step:

The resist remaining around the active nanowires NTj may then be removed with acetone, as illustrated in FIG. 6.

The above set of series of steps thus leads to only the active nanowires Nj being covered with the conductive layer.

Thus a substrate comprising an array of photoconductive nanowires allowing high-quality LEDs to be produced is obtained.

Figure 7A:
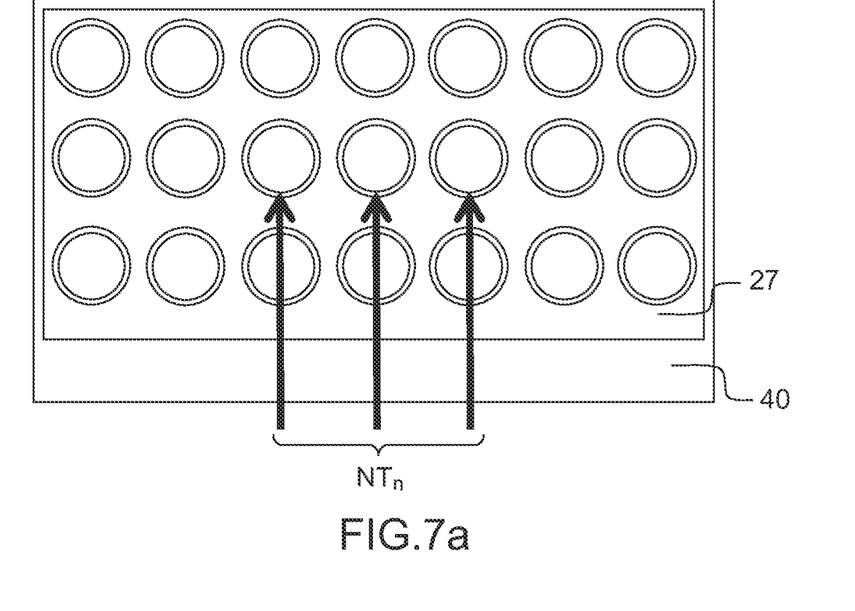
FIGS. 7a and 7b show schematic top views of nanowires connections to interconnect lines according to a conventional fabrication process and according to a process of the invention.
Figure 7B:
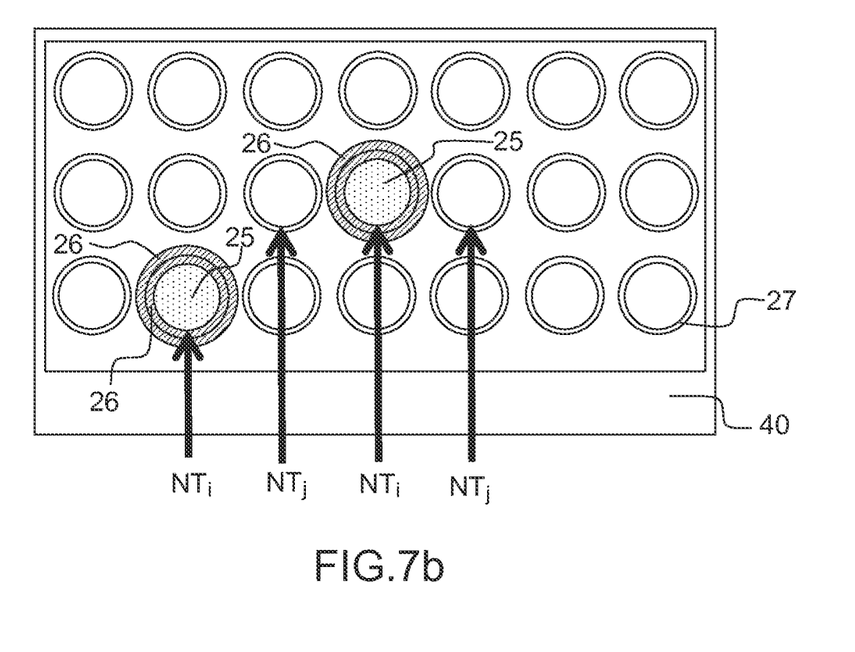

FIGS. 7a and 7b show the upper contact layer according to the prior art and according to the invention, which allows defective nanowires to be isolated.

FIG. 7a shows on its periphery a contact redistribution ring 40 on the substrate; all the nanowires NTn, including defective nanowires, make contact with the upper conductive layer 27.

FIG. 7b shows the configuration obtained with the process of the present invention, showing that defective nanowires Ni no longer make contact with the layer 27, said defective nanowires being disengaged, their top portion 25, and locally the dielectric layer 26, being exposed.

A Second Example of a Fabrication Process:

A variant of the process of the invention may comprise using a positive photoresist to produce absorbent features and then employing an nonconformal negative photoresist.

Figure 8A:
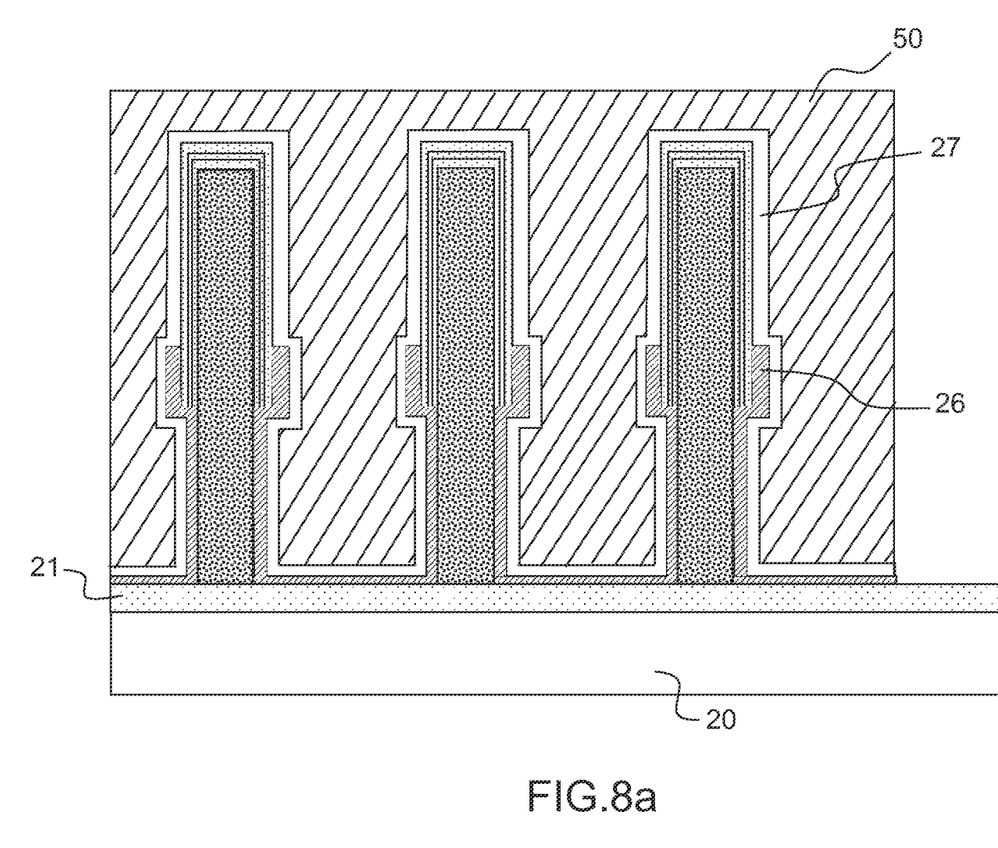
FIGS. 8a to 8d illustrate a first series of steps of a second example of a process according to the invention, which steps comprise using a positive photoresist and producing positive resist features allowing a structure equivalent to that illustrated in FIG. 4a of the first example of fabrication to be obtained.

To do this, as illustrated in FIG. 8a, after the set of steps notably described above in the first series of steps of the first example, to produce nanowires on the surface of the substrate a positive photoresist 50 sensitive to an auxiliary wavelength λa belonging to a spectral domain other than the emission domain of the nanowires (typically this wavelength may be located in the UV domain and more precisely below 370 nm) is deposited.

Figure 8B:
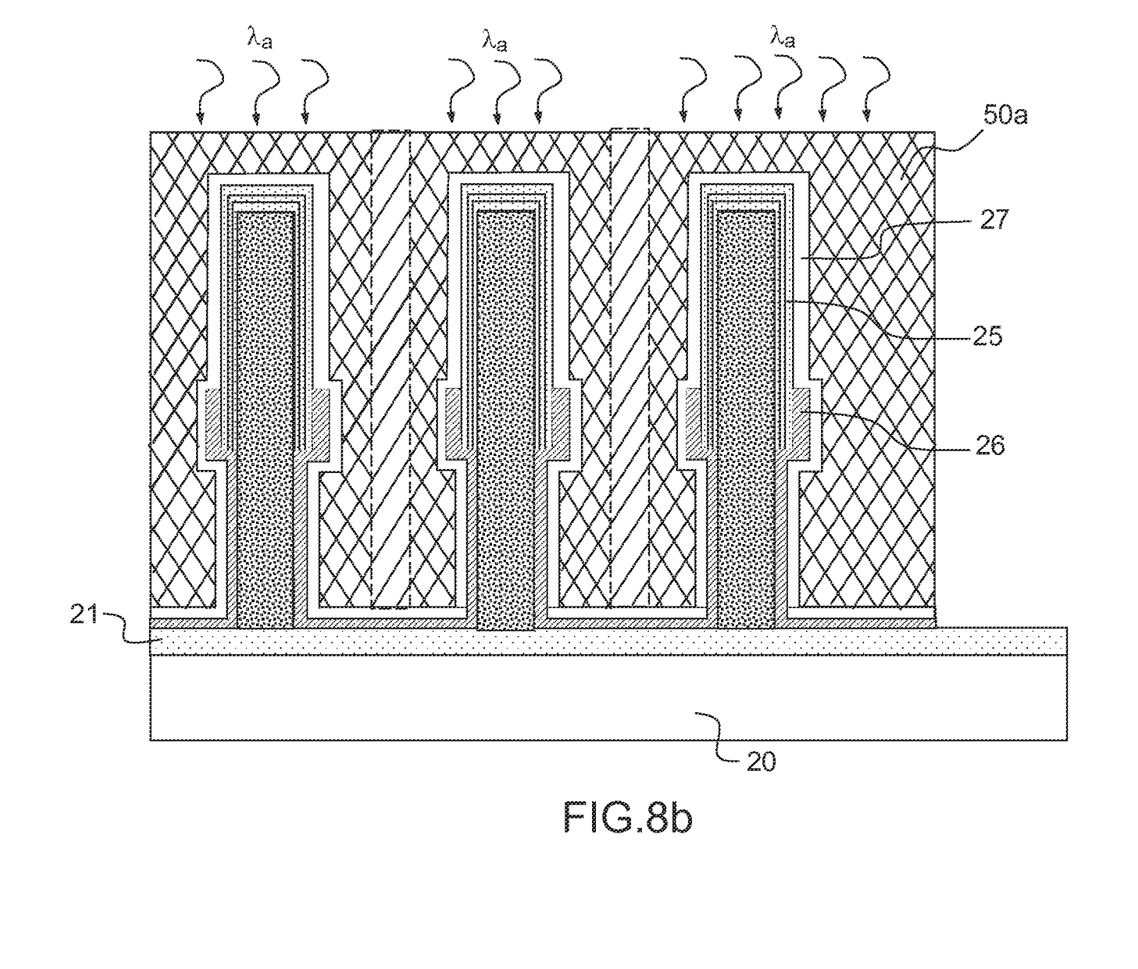

FIG. 8b shows the local exposure step, allowing regions 50a of increased solubility to be formed.

Figure 8C:
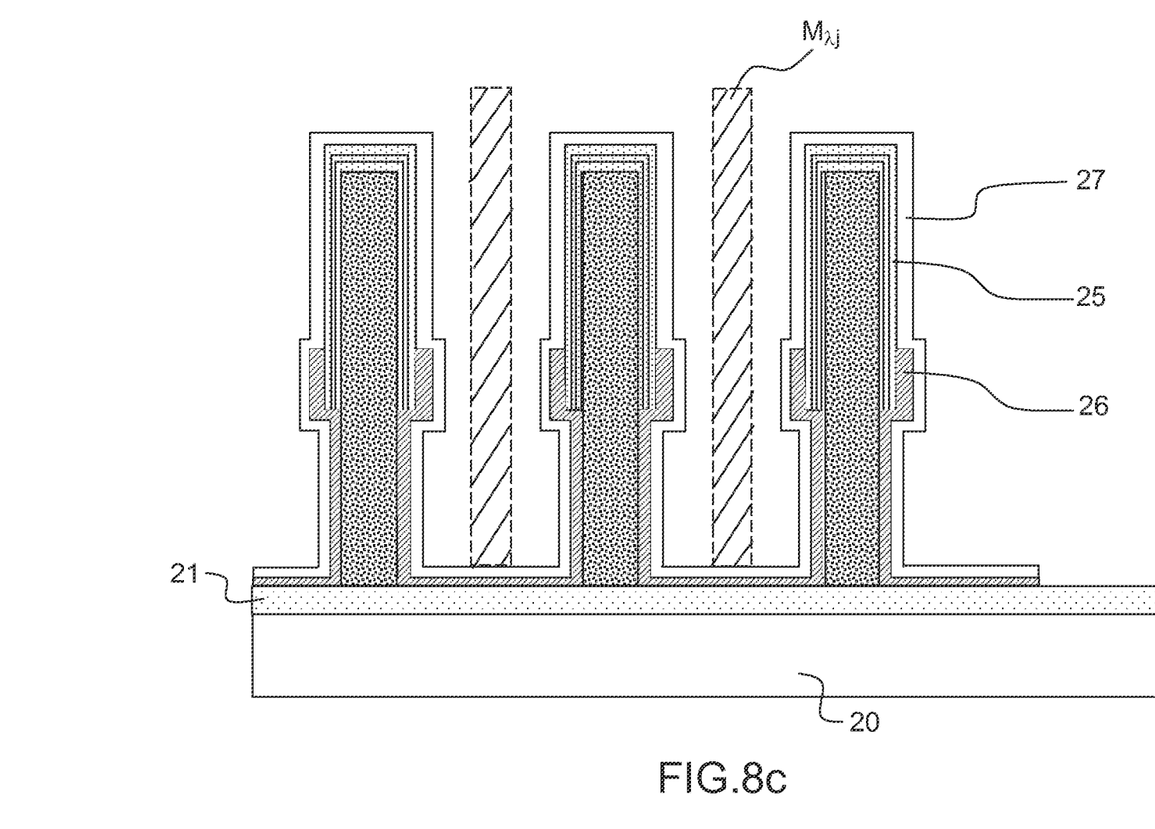

Development of this positive resist leaves features Mλj (which were not dissolved during the development of said positive resist) on the surface of the substrate between two consecutive nanowires, as illustrated in FIG. 8c.

Figure 8D:
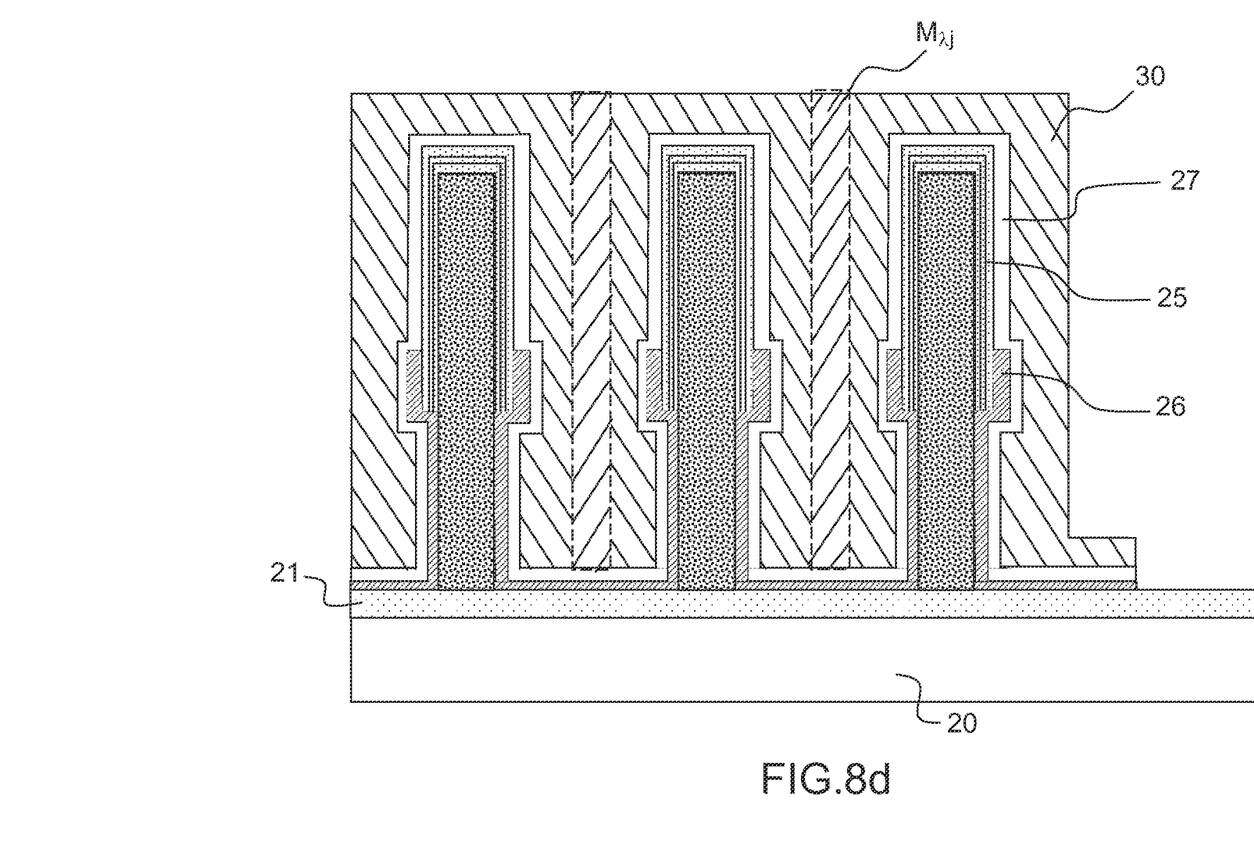

Next, the negative photoresist 30, which is sensitive to the wavelength λ, is deposited, there being no need for this resist to form a conformal coating; the resist is deposited over the positive resist and the features Mλj, as illustrated in FIG. 8d.

The above set of steps may be equivalent to that of the first exemplary process described above.

Whatever the previously described process for fabricating nanowires, it allows, on the wafer scale, a wafer comprising nanowires with a density possibly of the order of 107 nanowires/cm2, these nanowires being organized into subsets, each subset being connected to connection pads, to be processed. A test method allows, on the wafer scale, each and every defective nanowire to be revealed and electrically isolated and then the unitary cutting intended to produce individual LEDs to be carried out.

The invention claimed is:

1. A process for fabricating an array of nanowires on the surface of a substrate, said nanowires comprising a portion capable of emitting radiation at at least one wavelength under the action of an electrical or optical control and being at least partially connected to one another electrically via a conductive upper layer, comprising steps allowing a subset of defective nanowires to be identified among active nanowires, said steps comprising:
    producing a layer of negative photoresist sensitive to said emission wavelength, covering the array of said nanowires;
    activating the array of said nanowires under electrical control or optical control, so that said active nanowires emit said radiation, said radiation decreasing the solubility of said negative resist;
    developing said resist level with the defective nanowires, leaving zones made less soluble and encircling said active nanowires; and
    removing said conductive layer above said defective nanowires.

2. The process for fabricating an array of nanowires on the surface of a substrate as claimed in claim 1, wherein said resist containing interstices between two consecutive nanowires, it comprises producing features that are absorbent at said wavelength λ in said interstices.

3. A process for fabricating an array of nanowires on the surface of a substrate, said nanowires comprising a portion capable of emitting radiation at at least one wavelength under the action of an electrical or optical control and being at least partially connected to one another electrically via an upper conductive layer, comprising steps of identifying a subset of defective nanowires among active nanowires, said steps comprising:
    depositing a layer of positive photoresist that is absorbent at said emission wavelength and sensitive to what is referred to as an auxiliary wavelength, covering all of said nanowires;
    exposing said positive resist, except in regions located between two consecutive nanowires, to radiation at said auxiliary wavelength so as to create features of decreased solubility;
    developing said positive resist so as to leave only said positive resist features of decreased solubility between two consecutive nanowires on the surface of said substrate;
    depositing a layer of negative photoresist sensitive to said emission wavelength, covering all of said nanowires and all of the features located between two consecutive nanowires;
    activating all of said nanowires under electrical control or optical control so that said active nanowires emit said radiation, said radiation decreasing the solubility of said negative resist;
    developing said negative photoresist level with the defective nanowires, leaving zones made less soluble and encircling said active nanowires; and
    removing said conductive layer above said defective nanowires.

4. The process for fabricating an array of nanowires on the surface of a substrate as claimed in claim 1, wherein the structure of the nanowires is based on a III-V heterojunction.

5. The process for fabricating an array of nanowires on the surface of a substrate as claimed in claim 1, comprising producing contacts through said negative photoresist.

6. The process for fabricating an array of nanowires on the surface of a substrate as claimed in claim 1, wherein said nanowires are activated by optical control at a wavelength possibly of about 235 nm.

7. The process for fabricating an array of nanowires on the surface of a substrate as claimed in claim 1, wherein the conductive layer is removed by a chemical operation.

8. The process for fabricating an array of nanowires on the surface of a substrate as claimed in claim 1, wherein the nanowires are based on GaN or an alloy containing GaN.

9. The process for fabricating an array of nanowires on the surface of a substrate as claimed in claim 8, comprising epitaxial growth of heterojunction nanowires based on GaN or an alloy containing GaN, GaN or an alloy containing n-doped GaN and GaN or an alloy containing p-doped GaN.

10. The process for fabricating an array of nanowires on the surface of a substrate as claimed in claim 9, comprising steps of axial epitaxial growth in a plane perpendicular to the substrate.

11. The process for fabricating an array of nanowires on the surface of a substrate as claimed in claim 9, comprising steps of radial epitaxial growth in a plane parallel to the plane of the substrate.

12. A process for wafer-scale fabrication of an array of light-emitting diodes on the surface of a substrate, comprising:
    the process for fabricating a series of arrays of nanowires on the surface of said substrate, said nanowires comprising a photo conductive portion capable of emitting radiation at at least one wavelength as claimed in claim 1; and
    cutting said substrate so as to obtain unitary light-emitting diodes each comprising one array of nanowires.

* * * * *